(12) United States Patent
Krtolica

(10) Patent No.: US 6,807,309 B1
(45) Date of Patent: Oct. 19, 2004

(54) LINEAR LIST COMPRESSION

(75) Inventor: Radovan V. Krtolica, Los Gatos, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 623 days.

(21) Appl. No.: 09/751,127

(22) Filed: Dec. 27, 2000

(51) Int. Cl.$^7$ ................................................ G06K 9/36
(52) U.S. Cl. ....................... 382/246; 382/180; 345/555; 358/426.02; 708/203
(58) Field of Search ................................ 382/243, 232, 382/133, 154, 190, 238, 173, 276; 345/555; 348/384.1; 358/426.02, 426.1; 708/203

(56) References Cited

U.S. PATENT DOCUMENTS

| | | | | |
|---|---|---|---|---|
| 4,807,043 A | * | 2/1989 | Kaku et al. ................. | 382/235 |
| 4,982,292 A | * | 1/1991 | Itoh et al. ................... | 382/233 |
| 5,025,479 A | | 6/1991 | Pastor ........................ | 382/38 |
| 5,033,104 A | * | 7/1991 | Amano ....................... | 382/177 |
| 5,067,165 A | | 11/1991 | Nishida ....................... | 382/19 |
| 5,138,673 A | * | 8/1992 | Yoshida et al. ............. | 382/238 |
| 5,319,469 A | * | 6/1994 | Moolenaar .................. | 382/236 |
| 5,644,648 A | | 7/1997 | Bose et al. ................. | 382/177 |
| 5,751,859 A | * | 5/1998 | Howard ...................... | 382/238 |
| 5,974,177 A | * | 10/1999 | Krtolica ..................... | 382/202 |
| 6,014,458 A | | 1/2000 | Wang ......................... | 382/176 |
| 6,052,208 A | * | 4/2000 | Lee ............................ | 358/468 |
| 6,115,497 A | * | 9/2000 | Vaezi et al. ................. | 382/174 |
| 6,125,207 A | * | 9/2000 | Merchant et al. ........... | 382/190 |

OTHER PUBLICATIONS

Author unknown, "Standardization of Group 3 Facsimile Terminals For Documents Transmission", International Telecommunication Union, Recommendation T.4, Apr. 1999.

Author unknown, "Facsimile Coding Schemes and Coding Control Functions For Group 4 Facsimile Apparatus", International Telecommunication Union, Recommendation T.6, 1988, 1993.

Srihari, Sargur N., et al., "Pattern Recognition: A Survey", The Encyclopedia of Computer Science and Engineering, 3$^{rd}$ Ed., 1992.

* cited by examiner

Primary Examiner—Bhavesh M. Mehta
Assistant Examiner—Barry Choobin
(74) Attorney, Agent, or Firm—Fitzpatrick, Cella, Harper & Scinto

(57) ABSTRACT

Methods, apparatus, and computer readable medium for compressing connected component objects (300) of bi-level images. The compression apparatus (204) can take various forms including apparatus for coding a stroke of an object (300) or for coding the entirety of the object (300), including plural strokes. The compression apparatus (204) typically includes a referencing module (205) for identifying at least one reference node (310), a coding module (206) for successively coding pixel runs (311-314) such that at least one run (311) is coded relative to the reference node (310) and other runs (312–314) are coded relative to previously coded runs, and a closing module (207) for terminating the process. Certain forms of the apparatus operate in a horizontal or a vertical mode only, never operate in horizontal mode during two consecutive coding operations, code each run using two code-words, and/or utilize modified Huffman coding techniques. Various compression methods of the general nature described above are also disclosed.

14 Claims, 9 Drawing Sheets

| Stroke Number | row [i] | Mode | Binary Code | Mode | Binary Code | |
|---|---|---|---|---|---|---|
| | 0 (310) | RN1 | | | | — 824 |
| 1 | 1 (311) | (-1, V) | 0 1 0 | (+1, V) | 0 1 1 | |
| | 2 (312) | (-2, V) | 0 0 0 0 1 0 | (+3, V) | 0 0 0 0 1 1 | ← 822 |
| | 3 (313) | (-1, V) | 0 1 0 | (+1, V) | 0 1 1 | |
| | 4 (314) | (-1, V) | 0 1 0 | (+1, V) | 0 1 1 | |
| | 5 (315) | RN2 | | | | — 826 |
| | 6 (316) | (-1, V) | 0 1 0 | (8B, H) | 0 0 1 0 0 0 1 0 1 | |
| | 7 (318) | (+1, V) | 0 1 1 | (-1, V) | 0 1 0 | |
| | 8 (320) | (0, V) | 1 | (0, V) | 1 | |
| | 9 (322) | (-1, V) | 0 1 0 | (0, V) | 1 | |
| | 10 (324) | (0, V) | 1 | (0, V) | 1 | |
| 2 | 11 (326) | (0, V) | 1 | (0, V) | 1 | ← 830 |
| | 12 (328) | (0, V) | 1 | (0, V) | 1 | |
| | 13 (330) | (0, V) | 1 | (0, V) | 1 | |
| | 14 (332) | (0, V) | 1 | (0, V) | 1 | |
| | 15 (334) | (+1, V) | 0 1 1 | (+1, V) | 0 1 1 | |
| | 16 (336) | (0, V) | 1 | (+1, V) | 0 1 1 | |
| | 17 (338) | RN3 | | | | — 852 |
| | | | | | | |
| | 5 (315) | RN2 | | | | — 826 |
| | 6 (317) | (12W, H) | 0 0 1 0 0 1 0 0 0 | (0, V) | 1 | |
| | 7 (319) | (+1, V) | 0 1 1 | (0, V) | 1 | |
| | 8 (321) | (0, V) | 1 | (+1, V) | 0 1 1 | |
| | 9 (323) | (+1, V) | 0 1 1 | (0, V) | 1 | |
| | 10 (325) | (0, V) | 1 | (0, V) | 1 | |
| 3 | 11 (327) | (+1, V) | 0 1 1 | (0, V) | 1 | |
| | 12 (329) | (0, V) | 1 | (0, V) | 1 | |
| | 13 (331) | (0, V) | 1 | (0, V) | 1 | ← 850 |
| | 14 (333) | (-1, V) | 0 1 0 | (0, V) | 1 | |
| | 15 (335) | (-1, V) | 0 1 0 | (0, V) | 1 | |
| | 16 (337) | (0, V) | 1 | (0, V) | 1 | |
| | 17 (338) | RN3 | | | | — 852 |
| | 18 (339) | (+1, V) | 0 1 1 | (-1, V) | 0 1 0 | |
| | 19 (340) | (+1, V) | 0 1 1 | (-1, V) | 0 1 0 | |
| 4 | 20 (341) | (+1, V) | 0 1 1 | (-1, V) | 0 1 0 | ← 870 |
| | 21 (342) | (+1, V) | 0 1 1 | (-1, V) | 0 1 0 | |
| | 22 (343) | (+1, V) | 0 1 1 | (-1, V) | 0 1 0 | |

LINEAR LIST COMPRESSION

BACKGROUND

1. Field of the Invention

The present invention pertains to the field of image analysis, and more particularly, to bi-level image segmentation, analysis, and compression.

2. Description of Related Art

In the field of image analysis, image recognition requires segmentation and interpretation of connected component objects found within an image. For bi-level images, a connected component object is a group of pixels of a given binary level or value, (e.g., 1 or black), completely surrounded by a group of pixels of the alternative binary level or value (e.g., 0 or white). Methods and apparatus for identifying connected component objects within an image, e.g., by performing line-by-line connected component analysis, are known in the art. One such example is disclosed in U.S. patent application Ser. No. 09/149,732, entitled "Segmenting and Recognizing Bi-level Images," filed on Sep. 8, 1998 and assigned to the same assignee as the present invention. U.S. patent application Ser. No. 09/149,732 is hereby incorporated by reference in its entirety in the present application.

Following connected component segmentation (or identification), image recognition typically proceeds by extracting a set of features for each connected component object which is needed by a given classification method to uniquely recognize a targeted object. Once this object data has been extracted, well known character recognition methods such as Bayesian, nearest neighbor, and/or neural network analysis may be used to classify each object by comparing object features with features obtained from a list of reference objects. When the features are similar enough, the unknown object is recognized and the known reference object can be, substituted for the previously unknown object during further document manipulation.

Various character recognition methods using feature extraction have been developed. For example, an intuitive, easy to implement and comprehensive method for feature abstraction is disclosed in U.S. patent application Ser. No. 09/661,865, entitled "Recognition in Clustering of Connected Components in Bi-level Images" filed on Sep. 14, 2000 and assigned to the same assignee as the present invention. U.S. patent application Ser. No. 9/661,865 is also hereby incorporated by reference in its entirety in the present application.

Other work in the field of imaging analysis has been directed to the compression of image data, either before or after a certain level of recognition occurs. One such compression algorithm is disclosed in the Blue Book of the International Telegraph and Telephone Consultative Committee (CCITT), Volume VII, Fascicle VII. 3 "Terminal Equipment and Protocols for Telemetic Services Recommendations" T.0–T.63 (p. 27 "Two-Dimensional Coding") (adopted at IXth ITU Plenary Assembly, Melbourne, Australia, Nov. 14–25, 1988). The relevant portions of this article are hereby incorporated by reference into the present application. The compression algorithm disclosed therein is known as "MODIFIED MODIFIED RELATIVE ELEMENT ADDRESS DESIGNATED CODE" (MMREAD or MMR). While MMR has been used to compress image data with a fair degree of effectiveness, its usage has not been optimized in all circumstances. Accordingly, MMR compression could be further modified to improve performance in a variety of circumstances; such improvements would include greater compression capability, reduced processing times, more efficient memory utilization, etc.

DISCLOSURE OF INVENTION

In one form, the invention comprises an apparatus (100) for coding one level of a bi-level image representing a connected component object (300). The apparatus can include an image segmenter (202) for identifying the connected component (300), a graph builder (203) for creating a graphic representation (400) of the connected component (300), a referencing module (205) for identifying reference nodes (310, 315, 338) of the graphic representation (400), a coding module (206) for successively coding pixel runs of the graphic representation (400), and a closing module (207) for marking the end of the compressed data.

In slighter greater detail, the graph builder (203) will be understood as creating a graphic representation (400) which includes a plurality of nodes and strokes (302, 303, 304, 305) such that the referencing module (205) can identify reference nodes (310, 315, 338) and at least one pixel run (311, 316, 317, 339) which can be coded relative to the reference nodes. Additionally, the successive coding performed by the coding module (206) entails coding a first pixel run (311, 316, 317, 339) of each stroke relative to a respective reference node and, additionally, coding the remaining pixel runs (312–314, 318–336, 317–337, 339–342) of each stroke relative to adjacent and previously coded pixel runs. This results in a coded list of pixel runs for each stroke. After the closing module (207) marks the end of each coded list for each stroke, the process (508) is repeated until the appropriate number of reference nodes and strokes have been fully coded. At that point, the entire connected component (300) will have been compressed.

In a particularly preferred form of the invention, the graphic representation generated by the graph builder (203) is an L-graph representation (400) including at least one beginning node (310) and one hinge node (315, 338), wherein each stroke (302–305) is associated with one of the beginning and hinge nodes, and wherein the referencing unit (205) identifies a node associated with each stroke as the reference node for that stroke. Moreover, it is particularly preferred that the coding module operates in either a horizontal mode or a vertical mode only, and that it never operates in the horizontal mode during two consecutive coding operations.

Other aspects of the invention are more narrowly tailored to methods (508) and apparatus for compressing individual strokes comprising plural substantially parallel pixel runs of the same level of a bi-level image. In such embodiments, the compressing algorithm (508) for a given stroke is at least generally similar to that described above.

Other desirable features of the present invention include the utilization of modified Huffman coding techniques for coding various pixel runs and coding each pixel run using two code-words, the first code-word encoding the beginning of the pixel run and the second code-word encoding the end of the pixel run. While the pixel runs forming each connected component object can be all black, with the area surrounding the connected component being any color other than black, it is particularly preferred that the pixel runs of the connected component be black pixels and the surrounding pixels be white pixels.

Method embodiments of the present invention are also disclosed. In pertinent part, such method embodiments include (a) determining a reference position of the strokes such that at least one pixel run can be coded relative to a reference position; (b) successively coding the pixel runs of the stroke such that a first pixel run is coded relative to the reference position and the remaining pixel runs are coded relative to adjacent and previously coded pixel runs; (c) wherein the coding includes coding of the pixel runs in either a horizontal or a vertical mode; and (d) wherein coding in the horizontal mode never occurs during two consecutive coding operations. Among other preferred method embodiment features are the use of modified Huffman coding techniques to code the pixel runs of a connected component and coding the connected component in either a horizontal mode or a vertical mode only. Additionally, the step of coding could include coding each pixel run using two code-words the first code-word encoding the beginning of the pixel run and the second code-word encoding the end of the pixel run.

BRIEF DESCRIPTION OF THE DRAWINGS

These and other more detailed and specific objects and features of the present invention are fully disclosed in the following written description and drawings, in which:

FIG. 8 is a table showing compressed image data for the representative connected component object of FIG. 3 , the compressed data shown in FIG. 8 being generated in accordance with the compression algorithms described herein.

DETAILED DESCRIPTION OF THE PREFERRED EMBODIMENTS

Figure 1:
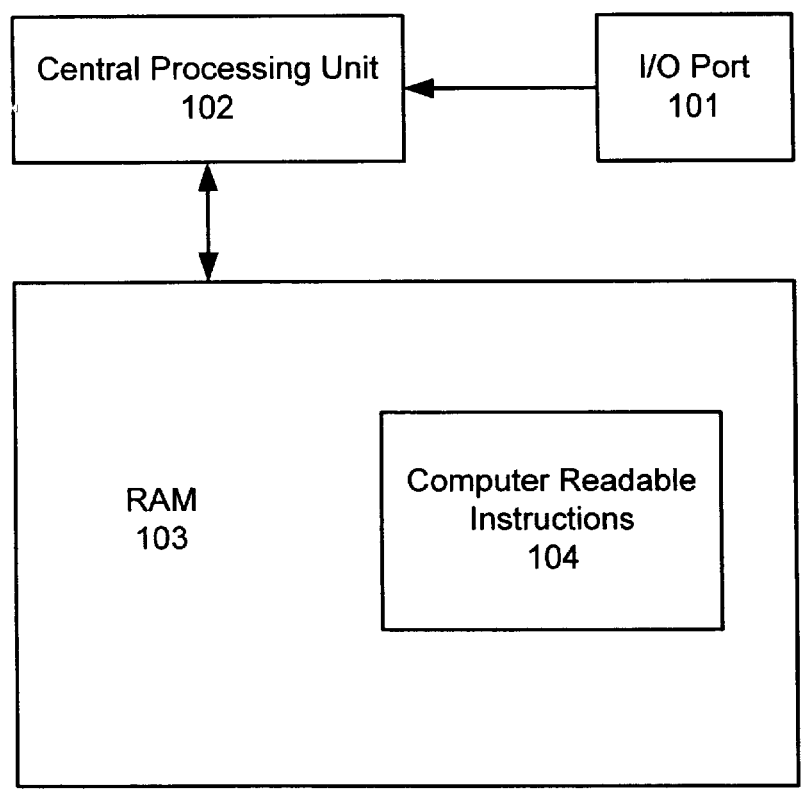
FIG. 1 is a block diagram illustrating a preferred apparatus embodiment of the present invention, the apparatus also being the environment in which the methods of the present invention are preferably implemented.

FIG. 1 is a block diagram illustrating a preferred computer apparatus 100 for carrying out the present invention As shown, the apparatus 100 consists of an input/output (or I/O) port 101, a central processing unit (or CPU) 102 and a random access memory (or RAM) 103 containing one or more novel computer programs 104 executable on the CPU 102. The I/O port 101 may be coupled to one or more user interface devices such as a document scanner, a video monitor, a printer, etc., as is known in the art. Alternately, they may be coupled to a modem, network interface card, or another of the many known devices for transmitting digital data over a computer network. Other types of apparatus for carrying out the invention are also possible and will readily occur to those of ordinary skill in the art based on this disclosure. For example, the computer program 104 can encompass a wide number of variations as described in greater detail below. Moreover, while the preferred embodiments of the present inventions are primarily described in terms of a computer program 104 which can be executed by a CPU 102, alternate embodiments of the invention employing combinations of software, firmware and/or hardware modules are possible. Such other embodiments may include instances in which one or more computer programs are etched into read only memory or performed in hardware by a dedicated integrated circuit or network of circuits.

Figure 2:
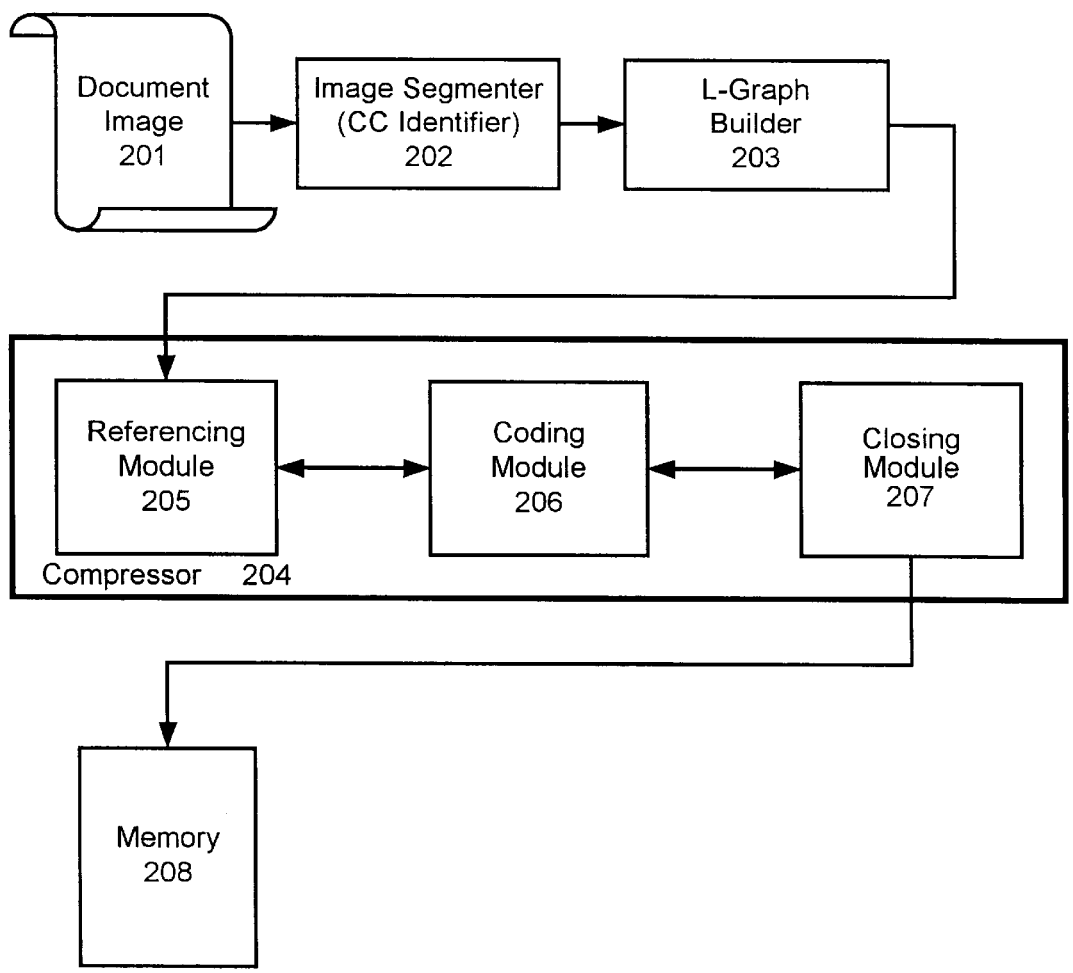
FIG. 2 is a block diagram illustrating preferred hardware, firmware and/or software modules to carry out various methods of the present invention.

FIG. 2 is a block diagram illustrating one preferred embodiment of hardware, firmware and/or software modules for carrying out the present invention. As shown therein, a document image 201 is received by a segmenter module 202 that preferably identifies all of the connected component objects contained within the document image 201, creates a list of all of the identified connected components, and stores each connected component object as a linked list of pixel runs of a given binary value. Image segmenter 202 then outputs the list of connected components for compression in accordance with the invention.

In the preferred embodiment, image segmenter module 202 is a conventional component which reads a scanned document 201 or image row-by-row and classifies each pixel run of a given binary value found within a row (e.g., a contiguous run of black pixels) by determining its connectivity to pixel runs of the same binary value in the immediately vertically preceding row. For a given pixel run, segmenter module 202 can determine whether each run is (1) not connected to a pixel run of the preceding row; (2) connected to a single pixel run of the preceding row; or (3) connected to a plurality of pixel runs in the preceding row. Upon processing all of the rows of pixels in a document image 201, image segmenter module 202 has identified each connected component object 300 within the image 201 and recorded pixel data for each of these connected component objects 300. Image segmenters are well known in the art, and those of ordinary skill will understand how to utilize these conventional segmenters in the context of the present invention.

The list of connected components 300 from image segmenter 202 is received by L-graph builder module 203, which generally determines the connectively relationships between the pixel runs in each of the identified connected component objects 300. L-graph builder module 203 then preferably records such data in a data structure, which reflects the simplified L-graph representation of each connected component 300.

Once L-graph builder 203 has generated an L-graph representation of each connected component 300 from the document image 201, the resulting data is preferably passed to a compressor 204. In particular, the image data for each object is preferably passed to a referencing module 205, which identifies one of the L-graph nodes as a reference node for each respective stroke. The data is then preferably passed to a coding module 206, which preferably operates in a horizontal mode or a vertical mode only, for successively coding the pixel runs of each stroke to thereby create a new coded list of pixel runs for each stroke. Preferably, the coding unit 206 codes a first pixel run of each stroke relative to the previously identified reference node. Additionally, the coding unit 206 preferably codes the remaining pixel runs of each stroke relative to adjacent and previous coded pixel runs of the stroke. Finally, a closing module 207 of compressor 204 is used to mark the end of each coded stroke when the coding module 206 has coded all of the pixel runs of that stroke.

Typically, the compressed image data exiting compressor 204 is sent to a memory 208 (for example, RAM 103 of FIG. 1) for storage. Alternately, the compressed image data could be sent directly to a user interface device, a modem, a network interface card or other of the well known devices for transmitting digital data over a communication network.

Figure 3:
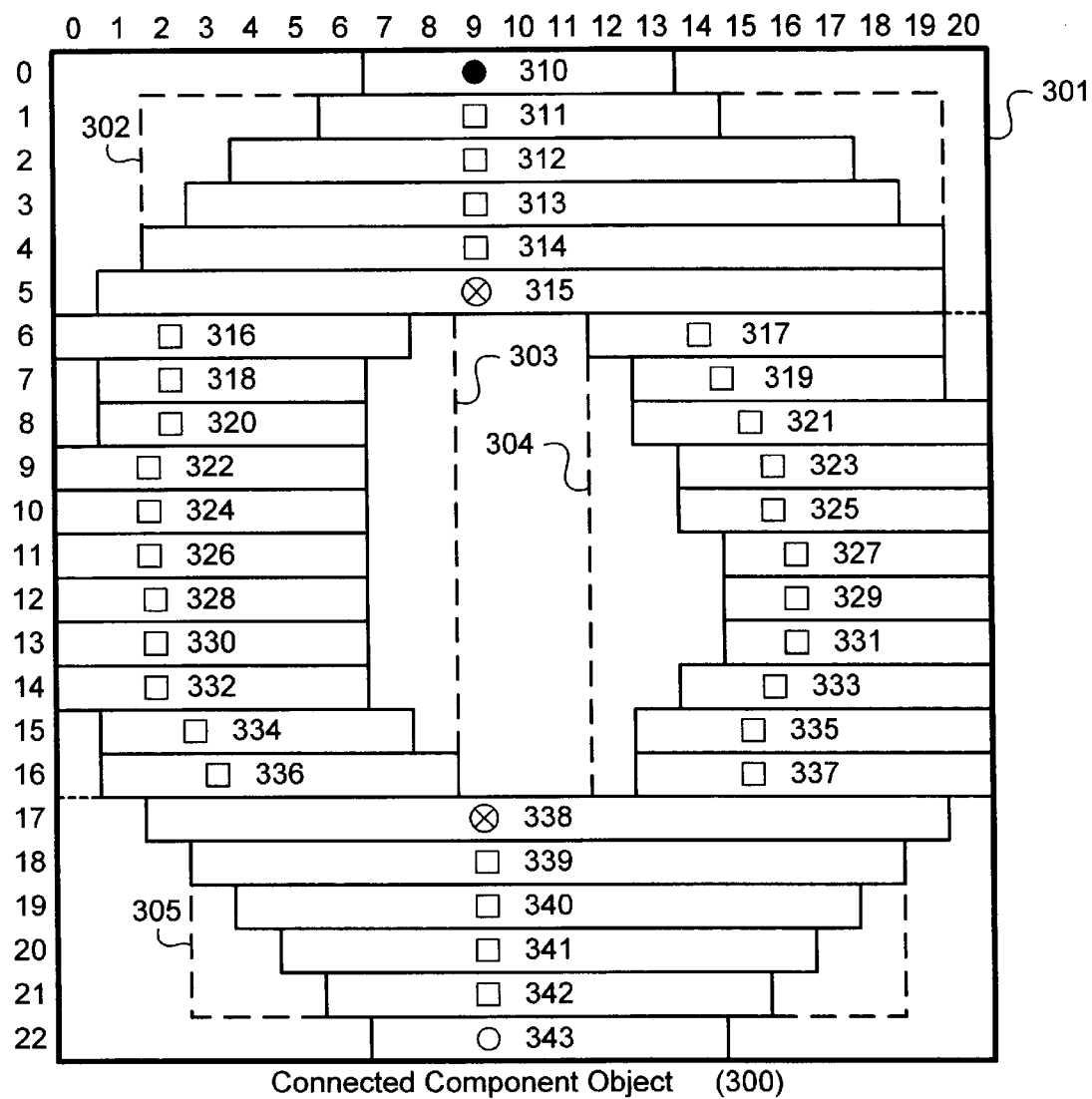
FIG. 3 is a graphic representation of a connected component object of a bi-level image, which results from a novel image analysis, this result being superimposed upon pixel runs comprising the object.

Turning now to FIG. 3, one example of a connected component object 300 comprising a plurality of pixel runs arranged in a plurality of substantially parallel pixel rows is illustrated therein. As shown, connected component object 300 includes pixel runs 310 through 343 contained in pixel rows 0 through 22. Connected component object 300 is, in human readable form, the letter "O" and, in this case, the minimal bounding rectangle for the entire object 300 is 21 pixels wide by 23 pixel rows tall. For simplicity, object 300 has been shown in a vertical/horizontal orientation and the analysis of this object is performed vertically from the top to the bottom pixel row. These directions are intuitively understood relative to the edges of a document. Those of ordinary skill, however, will readily appreciate that objects could occur with virtually any orientation and such objects can also be readily handled using the invention. Thus, as used herein the terms horizontal, vertical and their various conjunctives should be read broadly to cover any object orientation as long as they are understood to be at least substantially perpendicular to one another.

It will also be appreciated that while object 300 is shown as a letter of the English language, connected component objects 300 could be virtually any character of any language. Additionally, such objects could be any symbol (e.g., mathematical, typographic, monetary, linguistic, grammatic, etc.) meeting the definition of connected component as set forth herein. Therefore, a connected component object 300 could be any graphic image (including logos and pictures) of a single level of a bi-level image 201 that is completely surrounded by pixels of the opposite level of a bi-level image or document 201.

One significant drawback of utilizing a conventional data structure is that it does not capture information reflecting relationships between the various pixel runs forming each connected component object 300. Restated, a conventional data structure is essentially a catalog of pixel runs for each object 300. As discussed below, one aspect of the present invention is directed to using the data in a conventional form to generate data of a more sophisticated structure so that pixel run connectivity data can be captured. Once the image segmenter 202 generates pixel run data as discussed above, the data is passed to the L-graph builder 203 and it is then used by the L-graph builder 203 to generate L-graphs for each of the objects 300. This is described immediately below, and further in U.S. patent application Ser. No. 09/661,865 incorporated herein by reference.

Figure 4:
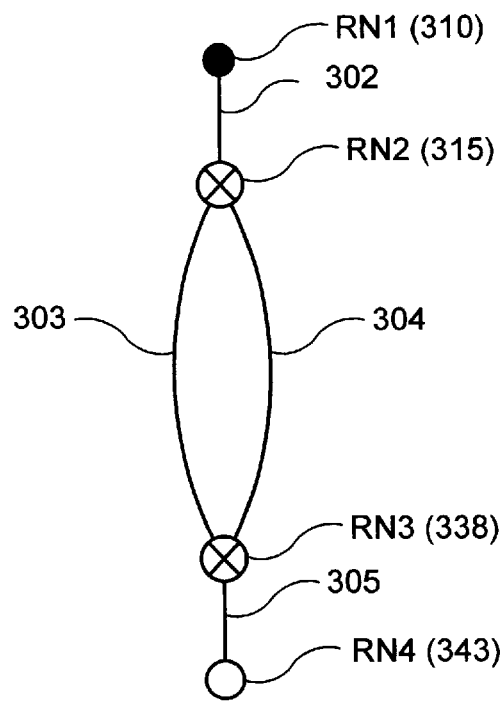
FIG. 4 is an L-graph representation of the connected component object shown in FIG. 3.

An L-graph (i.e., lumped graph) representation of the representative object 300 of FIG. 3 is shown in FIG. 4 For ease of reference, pixel runs associated with the L-graph and minimal bounding rectangles (see dotted lines) for each stroke or edge of the connected component object 300 are shown in FIG. 3. Corresponding pixel run numbers and bounding rectangle numbers are also included in FIG. 4. The L-graph 400 of FIG. 4 utilizes four types of nodes, which can be used to represent any connected component object 300 in L-graph form.

The preferred method of generating L-graphs entails analyzing the pixel runs of a targeted object beginning with the upper pixel row and proceeding vertically downward. The first of the four types of nodes used in the preferred system of nodal analysis is the beginning node. A beginning node is defined as a pixel run which does not have any pixel runs in the row of pixels which is adjacent and above the targeted pixel run. Node 310 of FIG. 4 is an example of a beginning node. A second type of node is a stroke node. A stroke node is defined as a pixel run which has exactly one vertically aligned run in the adjacent row above the targeted run and one vertically aligned run in the adjacent row below the targeted pixel run. Pixel runs 311 through 314 are examples of stroke nodes (collectively referred to as a stroke or edge) A third type of node is a hinge node. A hinge node is defined as a pixel run that has at least three vertically aligned runs in two adjacent pixel rows (e.g., one in the row above and two in the row below, or vice versa). Node 315 of FIG. 4 is an example of a hinge node because pixel run 314 lies immediately above node 315 and nodes 316 and 317 lie immediately below node 315. A final node type is the optional end node. An end node is one in which there are no runs in the row adjacent and below the pixel run of the node. An example of an end node is 343 of FIG. 4. An end node can be used to signify the end of the process of compressing an object 300. Together, these four types of nodes are the preferred node types utilized to generate L-graph representations of any connected component object 300.

L-graph 400, which is the L-graph representation of object 300 of FIG. 3, is shown in FIG. 4. Applying the definitions for beginning, stroke, hinge, and end nodes to the pixel run data shown in FIG. 3 and replacing adjacent stroke nodes with strokes result in generation of the L-graph 400 of FIG. 4. While L-graph 400 is an accurate, abbreviated and intuitive representation of object 300, a complementary data compression algorithm is desirable for more efficient computer based manipulation, storage and/or transmission of that data.

Figure 5:
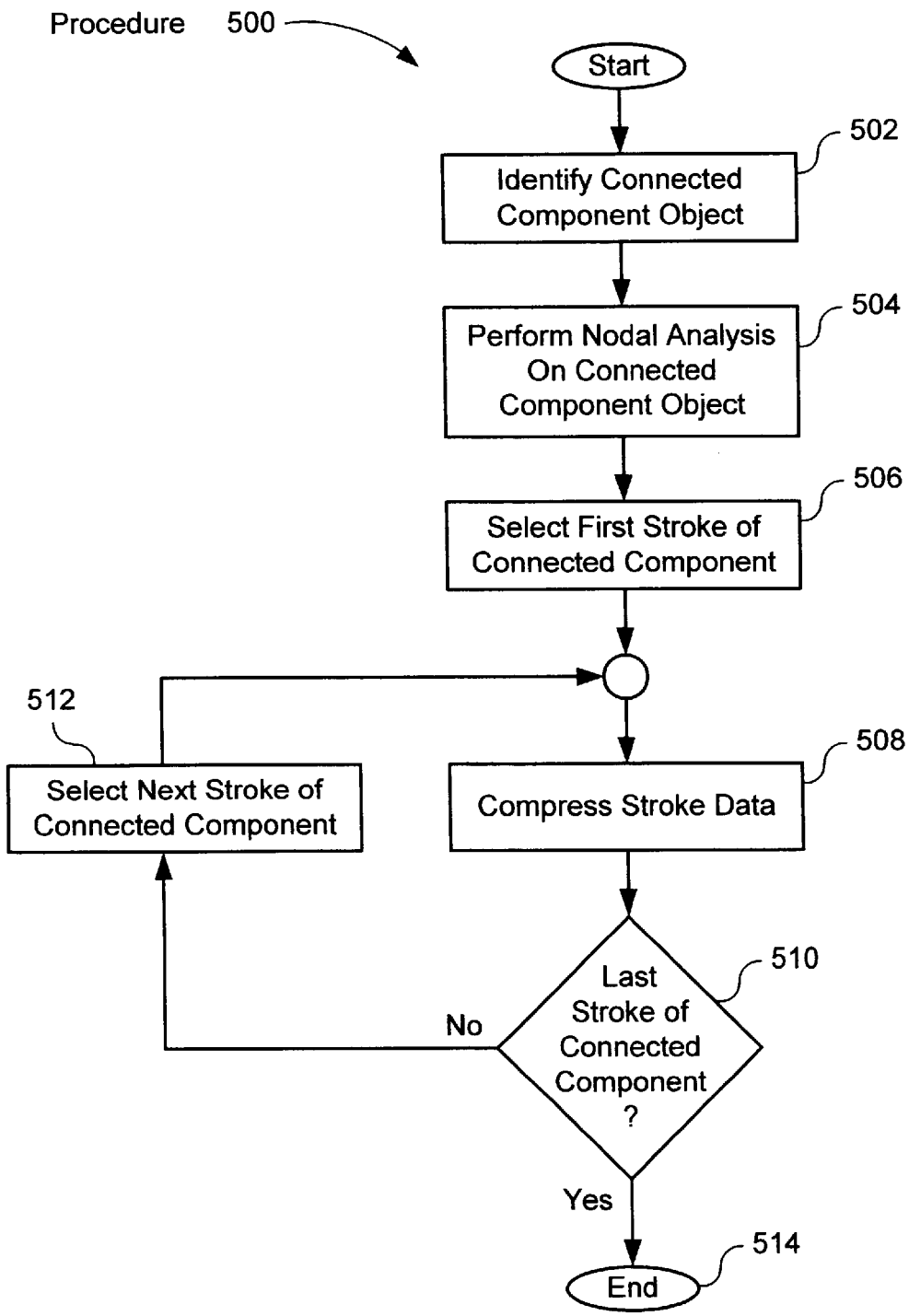
FIG. 5 is a block diagram of a compression algorithm for compressing a connected component object in accordance with a preferred embodiment of the present invention.

As shown in FIG. 5, a preferred procedure 500 for compressing the image data of a connected component begins as the image segmenter 202 identifies a given connected component object 300 at block 502. Then, a novel analysis is preferably performed on the connected component object 300 at block 504 in accordance with U.S. patent application Ser. No. 09/661,865, resulting in an L-graph representation of the connected component. At block 506, a first stroke of the connected component is selected for compression and the data is compressed at block 508. At block 510, it is determined whether the last stroke of the connected component has been compressed. If not, another stroke of the connected component is selected at block 512 and the process passes through blocks 508 and 510 until the last stroke of the connected component has been compressed. When this is the case, procedure 500 terminates at block 514.

Figure 6:
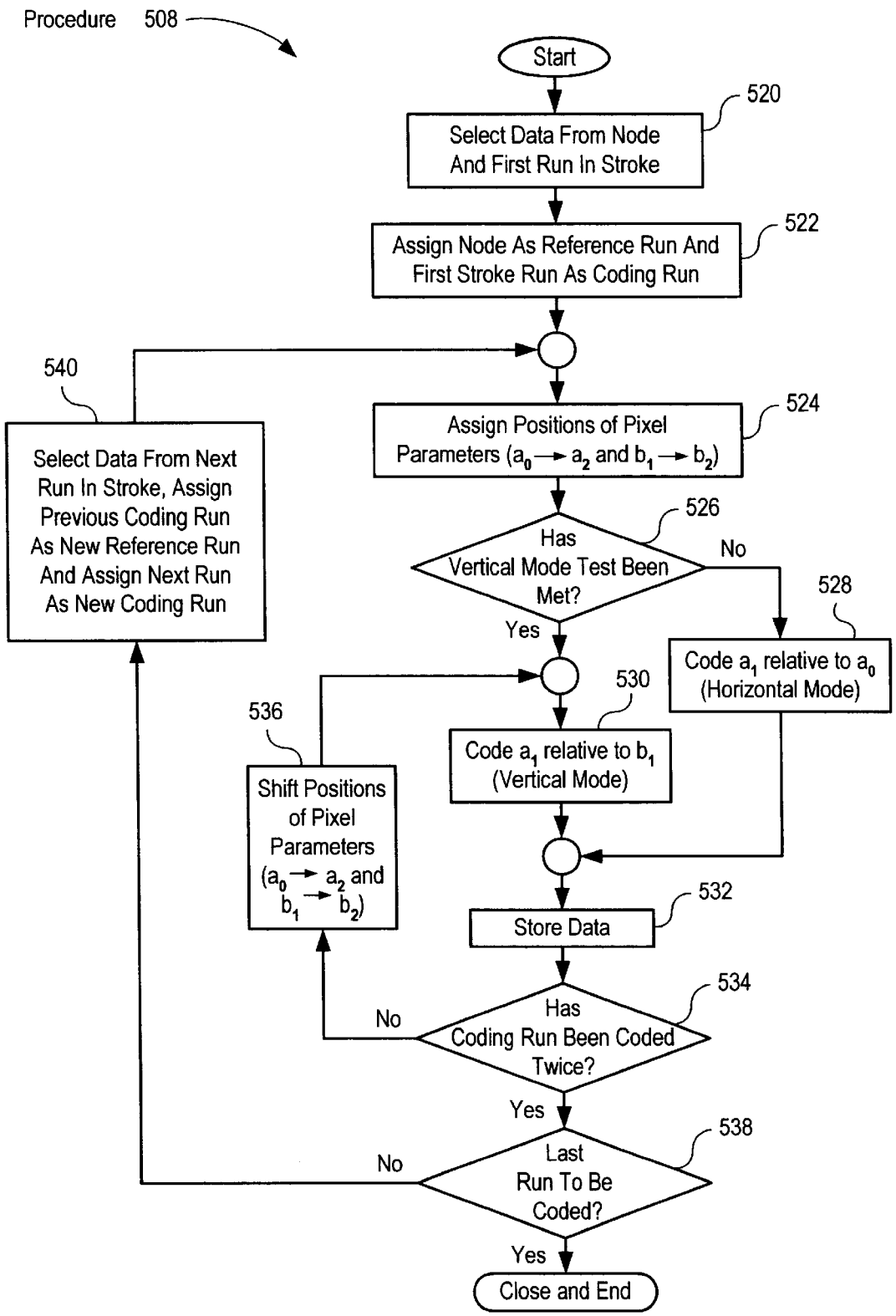
FIG. 6 is a block diagram of a compression algorithm for compressing a single stroke in accordance with another preferred embodiment of the present invention.

The procedure for compressing stroke data of block 508 is shown in detail in FIG. 6. As shown therein, the procedure of block 508 for compressing a single stroke of the connected component 300 begins as pixel data from a reference node and the first run in the stroke are selected at block 520. The reference node is then assigned as a reference run and the first pixel run of the stroke is assigned as the coding run at block 522. The process then passes to block 524 where pixel parameters $A_0$, $A_1$, $A_2$, $B_1$ and $B_2$ are assigned.

The procedure for assigning pixel parameters $A_0$ through $B_2$ follows. Pixel parameter Ao is initially the reference or starting changing pixel on any given coding line. If the first pixel run in the stroke is being coded, Ao is set on an imaginary white changing pixel situated just before the first element on the coding line. A changing pixel is a pixel of a different level or value to an adjacent one or more pixels of the same row. Thus, it can be used to identify the beginning of a pixel run. As used herein, a changing pixel is preferably identified by analyzing a pixel row from left to right, the changing pixel signifying the boundary of a pixel run. As noted below, certain aspects of the invention assume the presence of an "imaginary" changing pixel at the beginning of a row.

If the pixel run to be coded is not the first pixel run of the stroke, the position of pixel parameter Ao is dependent upon the previous coding mode (either vertical or horizontal as defined below). In particular, if the vertical coding mode was previously used to code a given portion of a pixel run, the position of pixel parameter Ao corresponds with the previous location pixel parameter $A_1$ on the new coding line. If, on the other hand, the previous coding line was encoded in the horizontal mode, the position of $A_0$ corresponds with the previous position of pixel parameter $A_2$ on the new coding line.

The positions of pixel parameters $A_1$ through $B_2$ are independent of the coding mode utilized. For example, the position of $A_1$ is preferably always the first changing pixel to the right of pixel parameter Ao on the coding line. The position of pixel, parameter $A_2$ is preferably the first changing pixel to the right of $A_1$ on the coding line. The position of pixel parameter $B_1$ is preferably the first changing pixel on the reference line which is to the strict right of pixel parameter $A_0$ and is of an opposite value to pixel parameter $A_0$. Finally, pixel $B_2$ is preferably always the first changing pixel to the right of pixel parameter $B_1$ on the reference line.

In order to determine the most efficient way to encode a particular pixel run, it is determined at block 526 whether a vertical mode test has been met. The vertical mode test is passed when two changing pixels on vertically adjacent lines do not match (i.e., when the coding line continues with the same value beneath the second changing pixel on the reference line or further) and when the changing pixels are within three pixels of one another. If this is the case, pixel parameter $A_1$ is coded relative to pixel parameter $B_1$ at block 530, preferably using modified Huffman coding for the vertical mode. If the vertical mode test has not been met, a horizontal coding mode is selected, and pixel parameter $A_1$ is coded relative to pixel $A_0$ at block 528, preferably using modified Huffman coding for the horizontal mode. Regardless of whether vertical or horizontal mode has been utilized, however, process 508 will then pass to block 532, where the data is stored in a memory.

At this point, the location of the left hand side of a given pixel run has been encoded and stored in accordance with the invention. Then, a determination is made at block 534 whether the pixel run of the coding line has been coded twice. If not, this means only that the left hand side of the pixel run has been encoded, and the process passes to block 536, where the positions of pixel parameters Ao through $B_2$ are shifted to the right, so that encoding of the right hand side of the subject pixel run can occur. After block 536 is executed, the process passes through block 530, where coding of pixel parameter $A_1$ relative to $B_2$ occurs in the vertical mode. The procedure then passes to block 532, where the appropriately coded data is stored. It will then be determined at block 534 whether the subject pixel run has been coded twice (both the right hand and left hand boundaries of the pixel run).

At this point, the process passes to block 538, where it is determined whether or not the last pixel run of the stroke has been coded. If so, the process terminates. If not, the process passes through block 540, where data is selected from the next pixel run in the stroke where the previous coding run is assigned as the new reference run, and where the next pixel run of the stroke is assigned as the new coding run. The process then passes through blocks 524 through 538, as described above, until all of the pixel runs of the stroke have been encoded; at which point the end of the coded linear list is marked to indicate that the end of the stroke has been reached and the process terminated.

Figure 7A:
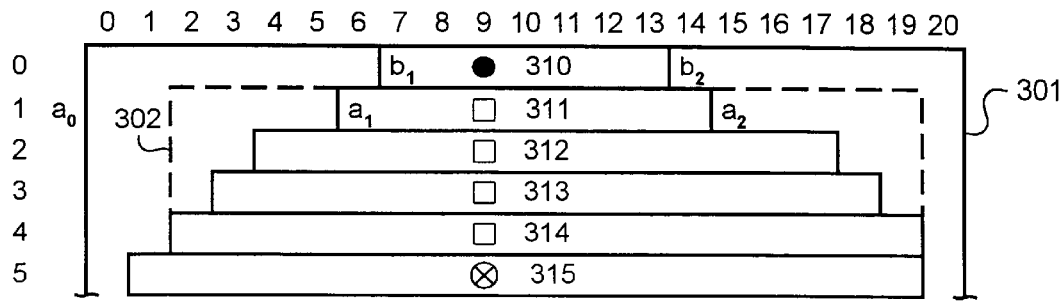
FIGS. 7a through 7h illustrate application of the compression algorithm in accordance with the embodiment of FIG. 6, the algorithm being applied to a representative single stroke of the connected component object illustrated in FIG. 3.

With joint reference to FIGS. 7A through 8, the preferred linear list compression algorithm of the present invention will now be applied to a representative stroke as an illustrative example. As noted above, the stroke illustrated in FIGS. 7A through 7H corresponds with the upper stroke of the connected component 300 illustrated in FIG. 3, is contained within minimal bounding rectangle 302, and has been labeled with like reference numerals to emphasize this point. The results of the inventive coding algorithm, as applied to the stroke of FIGS. 7A through 7H, are recorded in the portion of table 800 (FIG. 8) which corresponds to stroke number 1. Those of ordinarily skill will readily appreciate that the remainder of table 800 records the results of applying the coding algorithm of the present invention to the remainder of connected component 300 of FIG. 3. Additionally, those of ordinarily skill will appreciate how to derive the entries of FIG. 8 based on the description of the inventive algorithm above and the exemplary application as illustrated with respect to FIGS. 7A through 7H.

With reference now to FIGS. 7A through 7H, there is illustrated a portion of connected component 300 (FIG. 3), which includes substantially parallel pixel runs 310 through 315. The pixel runs include pixel runs 311 through 314 constituting a single stroke which is bounded by reference nodes 310 (a beginning node) and 315 (a hinge node). The stroke is also bounded by a minimal bounding rectangle 302 as shown in dotted lines in FIG. 3. A portion of the minimal bounding rectangle 301 for the entire connected component 300 is also shown is FIGS. 7A through 7H. Pixel column numbers 0 through 20, corresponding to the various pixel columns of minimal bounding rectangle 301, are indicated along the top of each of FIGS. 7A through 7H. Similarly, pixel row numbers 0 through 5, corresponding to a portion of the pixel rows of minimal bounding rectangle 301, are indicated in FIGS. 7A through 7H along the left side of each figure.

With primary reference to FIG. 7A, procedure 508 for compressing a single stroke commences with the selection of pixel run data for reference node 310 and from first run 311 of the stroke. As shown, node 310 is assigned as the reference run and pixel run 311 is assigned as the first coding run for this stroke. Once this has occurred, the positions of pixel parameters Ao through $B_2$ are assigned. In accordance with the pixel parameter rules set forth above, $A_0$ is set on an imaginary changing pixel situated to the immediate left of minimal bounding rectangle 302 on the coding line, because this constitutes initiation of the coding algorithm for the stroke. Also in accordance with the pixel parameter rules set forth above, parameter $A_1$ is assigned to the first changing pixel to the right of $A_0$ on the coding line; and parameter $A_2$ is assigned to the next changing pixel to the right on the coding line. Additionally, pixel parameter $B_1$ is set to the first changing pixel on the reference line which is to the strict right of $A_0$ and of an opposite value to $A_0$. In this case, $A_0$ is an imaginary white change pixel and, thus, $B_1$ is the first black pixel to the strict right of $A_0$ on the reference line. Finally, pixel parameter $B_2$ is set as the next changing pixel to the right of parameter $B_1$.

With initial values of $A_0$ through $B_2$ thus assigned, it must now be determined whether the vertical or horizontal mode of coding should be utilized. Since pixel parameter $B_2$ lies vertically above or strictly to the right of $A_1$, and since the absolute value of the distance between $A_1$ and $B_1$ is no greater than 3 pixels, the vertical mode should be utilized to encode the first entry for pixel run 311 relative to reference node 310. The left hand boundary of pixel 311 can thus be encoded in table 800 as follows: Sub table 822 indicates that for stroke number 1 (see column 810), row [1] corresponds to pixel run 311 (see column 812) and, applying vertical mode, the left hand end of pixel 311 is one unit to, the left of the left hand side of reference node 310. Thus, a resulting value of (−1, vertical) is recorded in column 814. This data is, finally, translated into a binary value using modified Huffman coding and placed in column 816 as "010".

Figure 7B:
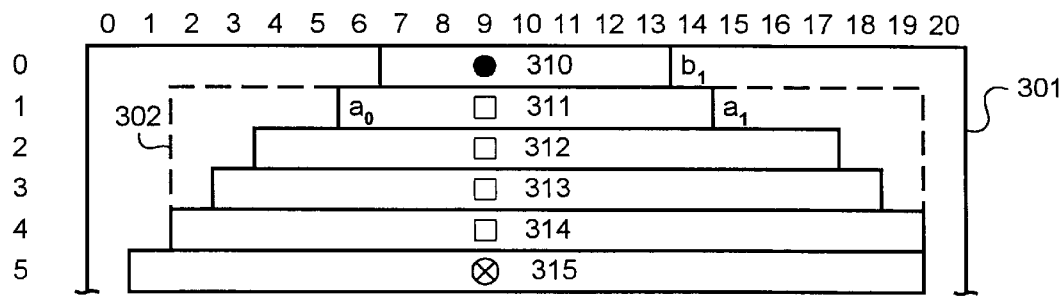

After a corresponding entry for the left hand side of pixel run 311 has been made, the positions of pixel parameters $A_0$ through $B_2$ are shifted to the right, because pixel run 311 has not yet been coded twice; this condition is shown in FIG. 7B, and in order to encode the right hand boundary of pixel run 311, pixel parameter $A_1$ is coded relative to $B_1$ in a vertical mode. Note that coding a stroke of a connected component 300 deals repetitively with two single overlapping pixel runs as long as one is still coding the same stroke. Therefore, there is no need for horizontal mode coding as defined in the MMR standard referenced above. The present invention modifies the MMR standard by coding only one pixel run by the modified Huffman code, instead of two. After horizontal mode coding, the position of referent parameter $A_0$ is set in the position of the previous parameter $A_1$ (instead of $A_2$ as in MMR). An additional implication of the fact that single stoke coding always entails two single overlapping pixel runs is that the present invention does not require the "pass" mode as defined in MMR.

Since $A_1$ is one pixel to the right of $B_1$, a corresponding entry (+1, vertical) is placed in column 818 of table 800. That entry is then translated into a binary value using modified Huffman coding and entered into column 820 as "011". Since coding run 311 has now been coded twice (once for the left hand boundary and once for the right hand boundary), it will then be determined whether the last pixel run of the stroke has been encoded.

Figure 7C:
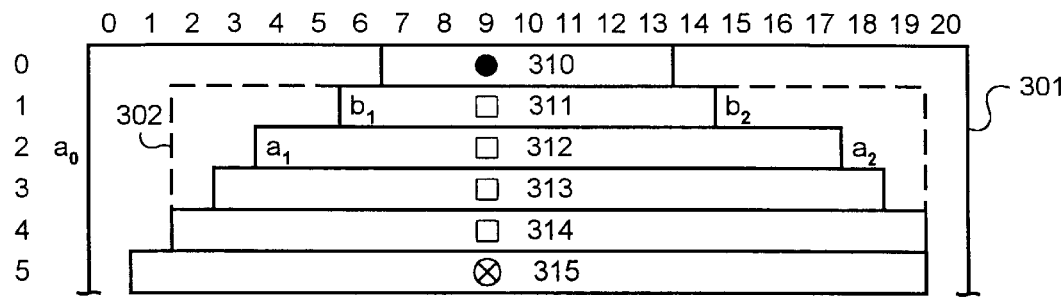
Figure 7D:
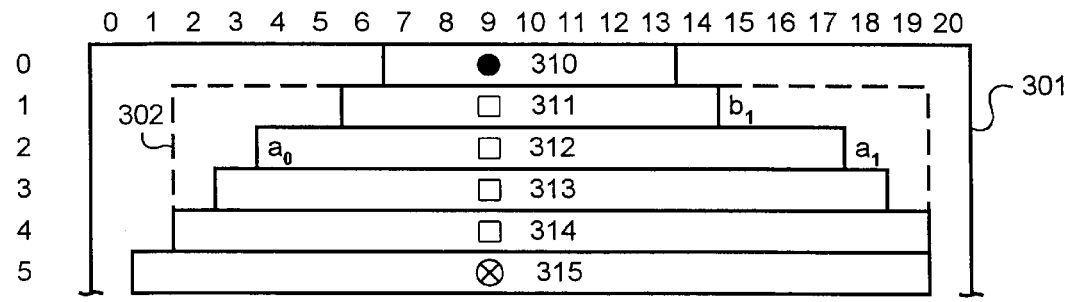

Since this test has not yet been met, the coding process is repeated with new data. In this case, data for pixel run 312 is selected and assigned as the new coding run, the data for previous coding run 311 is assigned as the new reference run and the data for reference node 310 is preferably discarded. With the focus now on pixel run 312 relative to pixel run 311, the positions $A_0$ through $B_2$ are assigned as shown in FIG. 7C. These values are assigned in accordance with the pixel parameter rules set forth above. Since $B_1$ is three units to the right of $A_1$, $A_1$ is coded relative to $B_1$ in a vertical mode. This results in a value of (−2, vertical) as shown in column 814 and "000010" in column 816. As that data is stored, the positions of pixel parameters $A_0$ through $B_2$ are shifted to the right for further evaluation In this case, $A_1$ is coded relative to $B_1$ in a vertical mode, which yields an entry of (+3, vertical) as shown in column 818 and "0000011" in column 820.

Since pixel run 312 has now been coded twice and additional pixel runs of this stroke have yet to be coded, the process repeats such that pixel run 313 is coded relative to pixel run 312.

Figure 7E:
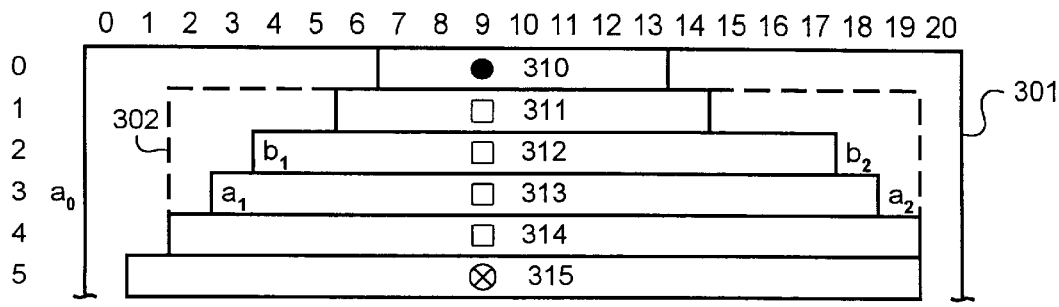
Figure 7F:
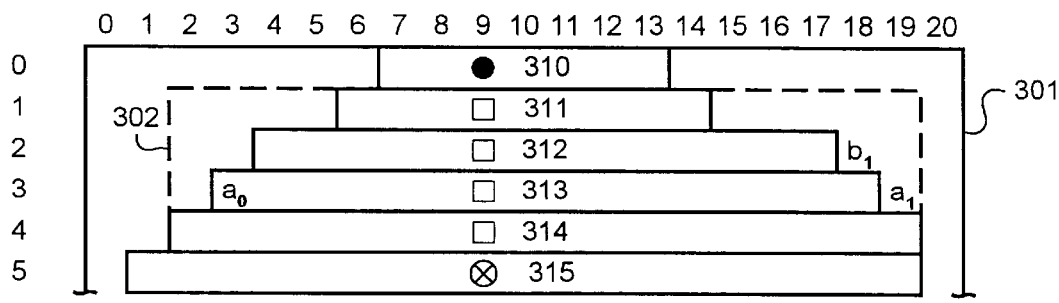

Thus, data from pixel run 312 is selected and assigned as the new coding run, while pixel run 312 is assigned as the new reference run, and data for pixel run 311 is discarded. As shown in FIG. 7E, pixel parameters $A_0$ through $B_2$ are assigned in accordance with the above noted pixel parameter rules, and parameter $A_1$ is coded relative to $B_1$. This yields an entry of (−1, vertical) as shown in column 814 and "010" in column 816. As shown in FIG. 7F, pixel parameters $A_0$ through $B_2$ are shifted to the right and parameter $A_1$ is coded relative to $B_1$ This yields an entry (+1, vertical) as shown in column 818 and "011" of column 820.

Figure 7G:
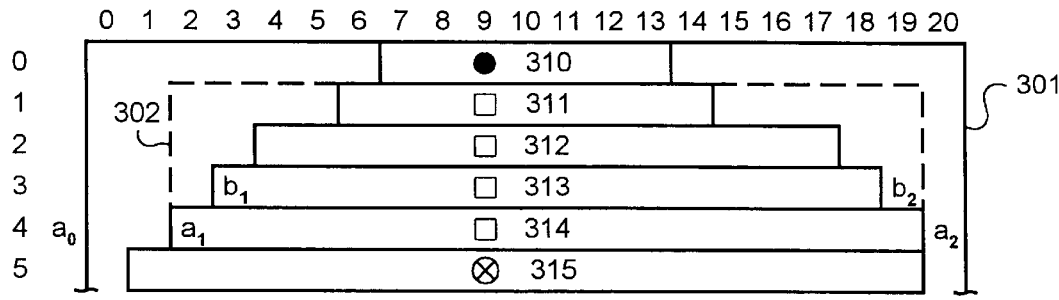
Figure 7H:
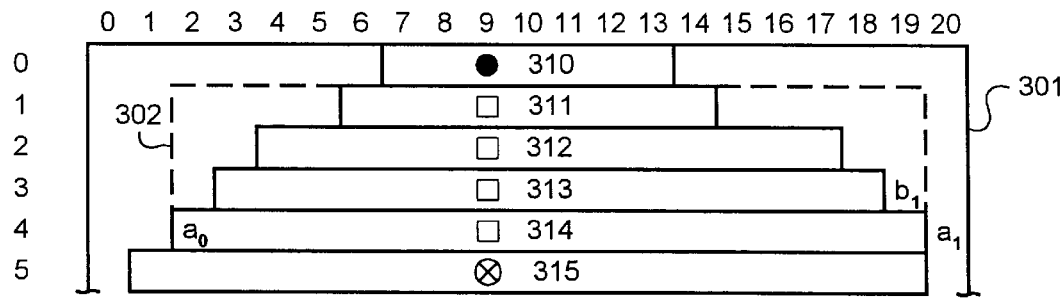

Coding of pixel run 314 relative to pixel run 313 is illustrated in FIGS. 7G and 7H, and is performed in a manner directly described above. The appropriate results are recorded in table 800. At this point, a determination is made that pixel run 314 is the last run to be coded in the stroke. Therefore, the end of the stroke (i.e., the end node) is marked and the process terminates with respect to this stroke.

Those of ordinary skill in the art will readily appreciate how to encode the remainder of the connected component object 300 (see FIG. 3) to complete the remainder of table 800 of FIG. 8 based on the disclosure above. However, to further illustrate various principles of the present invention, a brief description of horizontal mode operation of the coding algorithm is described immediately below. As shown in sub-table 830 of table 800, the second stroke of connected component 300 includes even numbered pixel runs 316 through 336, which are all encoded in a vertical mode, with an exception of the right hand boundary of pixel run 316; this is because the right hand boundary of reference node 315 (RN2) is more than three units away from the right hand boundary of pixel run 316. Accordingly, the vertical mode test specified above is not satisfied, and horizontal mode encoding is performed. In this case, the right hand boundary of pixel run 316 is coded relative to the left hand boundary of pixel run 316 (horizontal mode encoding). Since there are eight black pixels between the right and left hand boundaries of pixel run 316, horizontal coding results in a table entry of (+8B, horizontal) as shown in column 818 of table 800. Naturally, the corresponding binary code for this value is shown as "001000101" in column 820 of table 800.

As a final example of horizontal mode encoding, the left hand boundary of pixel run 317 of the third stroke of connecting component 300 is discussed. Applying the coding algorithm rules set forth above, the left hand boundary of pixel run 317 must be tested relative to the left hand boundary of reference node 315 to determine whether the vertical or horizontal mode will be utilized. Since the left hand boundary of reference node 315 is more than 3 units away from the left hand boundary of pixel run 317, the left hand boundary 317 is encoded relative to the first pixel of an opposite color on the coding line (line 6). Since there are 12 white pixels between the beginning of coding line 6 and left hand boundary of pixel run 317, an entry of (12W, horizontal) is placed in column 814 of table 800 with a corresponding binary code placed column 816.

Naturally, the remaining strokes are compressed in the manner described above in order to complete compression of the entire connected component 300. Table 800 with sub-tables 830–870 is thus completed. Typically, this entire process is repeated until all of the connected components of a given page or document 201 have been compressed. Those of ordinary skill will recognize that the above described process results in recordation of connected components in a more abbreviated form relative to other compression schemes. It is, thus, more advantageous.

While the present invention has been described in connection with what is presently considered to be the most practical and preferred embodiments, it is to be understood that the invention is not strictly limited to expressly disclosed embodiments, but is intended to cover all the various modifications and equivalent arrangements included within the spirit and scope of the appended claims.

What is claimed is:

1. A linear list compression apparatus for coding a connected component object, the apparatus comprising:
   a segmenter module for identifying the connected component object;
   a graph builder module for creating a graphic representation for the connected component object segmented by said segmenter module, wherein the graphic representation includes a plurality of nodes and strokes created by said graph builder module;
   a compressor module comprising:
      a referencing module for identifying a reference node of each of the strokes such that at least one pixel run can be coded relative to the reference node;
      a coding module for successively coding pixel runs of each of the strokes based on modified Huffman coding techniques in order to thereby create a coded linear list of pixel runs, the coding module coding a first pixel run relative to the reference node and coding remaining pixel runs relative to adjacent and previously coded pixel runs, wherein the coding module operates in a horizontal mode or a vertical mode only; and
      a closing module for marking an end of the coded linear list when the coding module has coding all of the pixel runs of the stroke.

2. The apparatus of claim 1 wherein the pixel runs of the stroke are all black and the area surrounding the connected component is not black.

3. The apparatus of claim 1 wherein:
   the coding module never operates in the horizontal mode during two consecutive coding operations.

4. The apparatus of claim 1 wherein the coding module encodes each pixel run using two code-words, the first code-word encoding a beginning of the pixel run and the second code-word encoding an end of the pixel run.

5. The apparatus of claim 1 wherein the coding module operates in exactly one of the horizontal mode and the vertical mode.

6. A linear list compression apparatus for coding a stroke of a connected component, the stroke comprising plural substantially parallel pixel runs of the same level, the apparatus comprising:
   segmenter means for identifying the connected component object;
   graph builder means for creating a graphic representation for the connected component object segmented by said segmenter means, wherein the graphic representation includes a plurality of nodes and strokes created by said graph builder means;
   a compressor means comprising:
      means for determining a reference position of each of the strokes such that at least one pixel run can be coded relative to a reference position;
      coding means for selectively coding pixel runs of each of the strokes based on modified Huffman coding techniques in order to thereby create a coded linear list of pixel runs, the coding means coding a first pixel run relative to a reference position and coding remaining pixel runs relative to adjacent and previously coded pixel runs, wherein the coding means operates in a horizontal mode or a vertical mode only; and
      means for marking an end of the coded linear list when the coding means has coded all of the pixel runs of the stroke.

7. The apparatus of claim 6 wherein the pixel runs of the connected component are all black and the area surrounding the connected component is not black.

8. The apparatus of claim 6 wherein:
   the coding means never operates in the horizontal mode during two consecutive coding operations.

9. The apparatus of claim 6 wherein the coding means encodes each pixel run using a first code-word encoding the beginning of a pixel run and a second code-word encoding an end of the pixel run.

10. The apparatus of claim 6 wherein the coding means operates in exactly one of the horizontal mode and the vertical mode.

11. A linear list compression apparatus for coding one level of a bi-level image representing a connected component, the apparatus comprising:
   an image segmenter for identifying the connected component;
   a graph builder for generating a graphic representation of the connected component, the graphic representation including a plurality of nodes and strokes;
   a referencing module for identifying reference nodes from among graph nodes of each of the strokes such that at least one pixel run can be coded relative to each respective reference node;
   a coding module for successively coding pixel runs of each stroke based on modified Huffman coding techniques in order to thereby create a coded list of pixel runs for each stroke, the coding unit coding a first pixel run of each stroke relative to a respective reference node and coding remaining pixel runs of each stroke relative to adjacent and previously coded pixel runs of each stroke, wherein the coding module operates in a horizontal mode or a vertical mode; and
   a closing module for marking an end of each coded linear list when the coding module has coded all of the pixel runs of each stroke.

12. The apparatus of claim 11 wherein:
   the graph builder is an L-graph builder for generating an L-graph representation of the connected component, the L-graph including at least one of a beginning node and a hinge node, wherein each stroke is associated with one of the beginning and hinge nodes; and
   the referencing unit identifies the node associated with each stroke as the reference node for the respective stroke.

13. The apparatus of claim 11 wherein the coding module operates in exactly one of the horizontal mode and the vertical mode.

14. The apparatus of claim 11 wherein the coding module never operates in the horizontal mode during two consecutive coding operations.

* * * * *